(12) United States Patent
Shimomura et al.

(10) Patent No.: US 12,126,329 B2
(45) Date of Patent: Oct. 22, 2024

(54) DRIVING CIRCUIT

(71) Applicants: NISSAN MOTOR CO., LTD., Yokohama (JP); RENAULT s.a.s., Boulogne-Billancourt (FR)

(72) Inventors: Taku Shimomura, Kanagawa (JP); Keiichirou Numakura, Kanagawa (JP); Akinori Okubo, Kanagawa (JP)

(73) Assignees: NISSAN MOTOR CO., LTD., Yokohama (JP); RENAULT S.A.S., Boulogne-Billancourt (FR)

( * ) Notice: Subject to any disclaimer, the term of this patent is extended or adjusted under 35 U.S.C. 154(b) by 0 days.

(21) Appl. No.: 18/283,417

(22) PCT Filed: Mar. 22, 2021

(86) PCT No.: PCT/IB2021/000184
§ 371 (c)(1),
(2) Date: Sep. 21, 2023

(87) PCT Pub. No.: WO2022/200819
PCT Pub. Date: Sep. 29, 2022

(65) Prior Publication Data
US 2024/0178829 A1    May 30, 2024

(51) Int. Cl.
*H03K 17/06* (2006.01)
*H03K 17/687* (2006.01)

(52) U.S. Cl.
CPC ....... *H03K 17/063* (2013.01); *H03K 17/6871* (2013.01); *H03K 2217/0063* (2013.01); *H03K 2217/0072* (2013.01)

(58) Field of Classification Search
CPC ............. H03K 17/063; H03K 17/6871; H03K 2217/0063; H03K 2217/0072
See application file for complete search history.

(56) References Cited

U.S. PATENT DOCUMENTS 4,949,213 A     8/1990  Sasagawa et al.
9,496,864 B2 *  11/2016 Wagoner .............. H03K 17/166
(Continued)

FOREIGN PATENT DOCUMENTS

JP    H11-308084 A    11/1999
JP    2001-136732 A    5/2001
(Continued)

*Primary Examiner* — Metasebia T Retebo
(74) *Attorney, Agent, or Firm* — Foley & Lardner LLP

(57) ABSTRACT

A driving circuit applies a voltage to a switching element to switch between an ON state and an OFF state. The switching element includes a control terminal, a high-potential terminal, and a low-potential terminal, and is switched between the ON state and the OFF state depending on the voltage of the control terminal in a case in which a potential of the low-potential terminal is defined as a reference potential. The driving circuit includes a negative-voltage power supply for applying a negative voltage as the voltage to the control terminal when the switching element is switched from the ON state to the OFF state, and a voltage changing unit for changing the voltage immediately before the switching element is switched from the OFF state to the ON state to be higher than the negative voltage immediately after the switching element is switched from the ON state to the OFF state.

7 Claims, 3 Drawing Sheets

(56) References Cited

U.S. PATENT DOCUMENTS

| | | |
|---|---|---|
| 10,511,302 B2 | 12/2019 | Araragi |
| 2001/0015670 A1 | 8/2001 | Sakai et al. |
| 2010/0109750 A1 | 5/2010 | Barrenscheen |
| 2010/0176783 A1 | 7/2010 | Tagome |
| 2011/0228564 A1 | 9/2011 | Uruno et al. |
| 2017/0040992 A1* | 2/2017 | Nakano ............ H03K 17/04123 |
| 2019/0181854 A1 | 6/2019 | Shimomura et al. |

FOREIGN PATENT DOCUMENTS

| | | |
|---|---|---|
| JP | 2007-235859 A | 9/2007 |
| JP | 2011-193705 A | 9/2011 |
| JP | 2014-068326 A | 4/2014 |
| JP | 2019-009846 A | 1/2019 |
| WO | WO-2017/216974 A1 | 12/2017 |

\* cited by examiner

DRIVING CIRCUIT

TECHNICAL FIELD

The present invention relates to a driving circuit.

BACKGROUND ART

A gate driving circuit disclosed in Patent Literature 1 is provided with a gate-off power supply for switching off a switching element connected to a DC power supply and a gate-on power supply for switching on the switching element. The gate driving circuit reliably switches the switching element between an ON state and an OFF state by means of the power supply between the gate-off power supply and the gate-on power supply.

The gate-off power supply for switching off the switching element makes the voltage of the gate-off power supply negative such that the gate potential of the switching element is smaller than the source potential.

In a case where a switching element for power conversion is used in a hard switching state such as a half-bridge, erroneous turn-on is likely to occur when high-speed switching is performed to reduce the loss. For this reason, in existing circuits, a negative voltage of a gate-off power supply is applied to a gate of a switching element to suppress erroneous turn-on.

CITATION LIST

Patent Literature

Patent Literature 1: Japanese Patent Unexamined Publication No. 2019-9846

SUMMARY OF INVENTION

Technical Problem

However, when a switching element is switched from OFF to ON (turn-on), the negative voltage immediately after the switching element is switched from ON to OFF is applied to the gate of the switching element.

In order to switch on a switching element, it is necessary to increase the gate voltage from the negative voltage to be greater than the threshold voltage of the switching element by means of the gate-on power supply, which results in a longer turn-on time. In addition, diode loss of the switching element increases due to time in which switching elements of upper and lower arms are prevented from switching ON simultaneously, that is, due to dead time.

An object of the present invention is to provide a driving circuit that is capable of suppressing erroneous turn-on and increasing turn-on speed.

Solution to Problem

A driving circuit according to the present invention applies a voltage to a switching element to switch between an ON state and an OFF state. The switching element includes a control terminal, a high-potential terminal, and a low-potential terminal, and is switched between the ON state in which a current flows between the high-potential terminal and the low-potential terminal and the OFF state in which the current does not flow therebetween, depending on the voltage of the control terminal in a case in which a potential of the low-potential terminal is defined as a reference potential. The driving circuit includes a negative-voltage power supply and a voltage changing unit. The negative-voltage power supply applies a negative voltage as the voltage to the control terminal when the switching element is switched from the ON state to the OFF state. The voltage changing unit changes the voltage immediately before the switching element is switched from the OFF state to the ON state to be higher than the negative voltage from the negative-voltage power supply immediately after the switching element is switched from the ON state to the OFF state.

DESCRIPTION OF EMBODIMENTS

Figure 1:
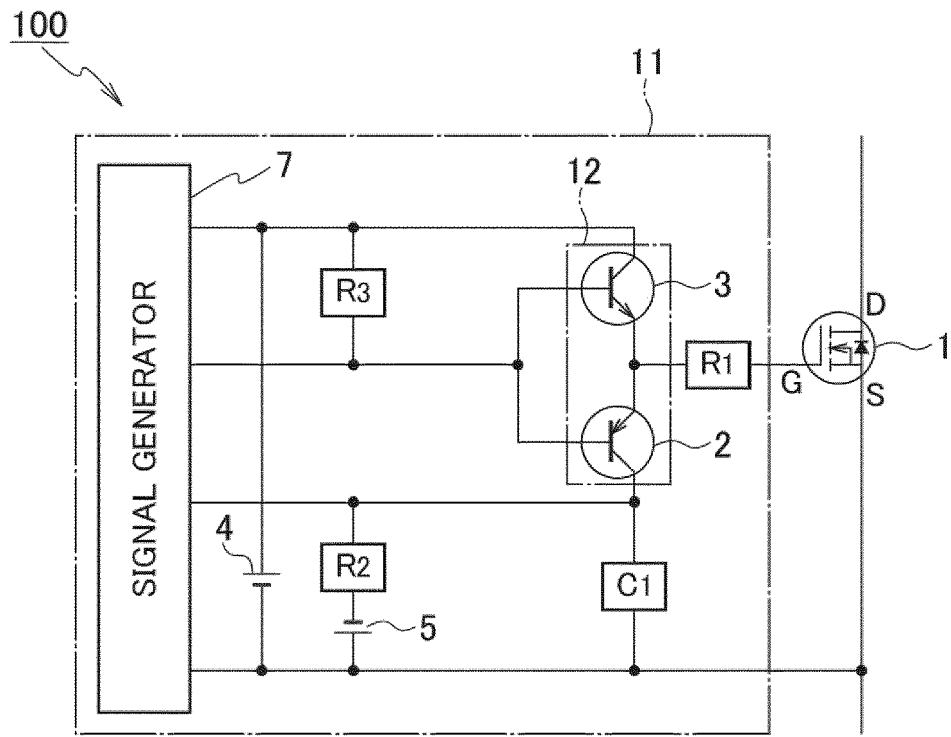
FIG. 1 is a configuration diagram of a driving circuit according to a first embodiment of the present invention.

Driving circuits according to some embodiments of the present invention will be described below with reference to the drawings. The same or equivalent parts illustrated in the drawings of the driving circuits according to the respective embodiments are denoted by the same reference numerals, and the description thereof is omitted.

First Embodiment

FIG. 1 is a configuration diagram of a driving circuit according to a first embodiment of the present invention. The driving circuit according to the first embodiment uses a MOSFET (Metal Oxide Semiconductor Field Effect Transistor) as an example of a switching element 1. A plurality of switching elements 1 form a bridge circuit or the like by being arranged in series or parallel, and can be used for a power converter or the like. It should be noted that the switching elements 1 are not limited to unipolar types, bipolar types, bandgaps of element materials, or the like.

The switching element 1 includes a gate (control terminal), a drain (high-potential terminal) and a source (low-potential terminal), and is switched between an ON state in which a current flows between the drain and the source and an OFF state in which the current does not flow therebetween, depending on a voltage of the gate in a case in which a potential of the source is defined as a reference potential.

The driving circuit 11 applies a gate voltage to the switching element 1 to switch between an ON state and an OFF state, and includes a push-pull circuit 12, a positive-voltage power supply 4, a negative-voltage power supply 5, a signal generator 7, resistors R2 and R3, and a capacitor C1.

The push-pull circuit 12 includes a PNP-type transistor 2 (P-type second transistor) and an NPN-type transistor 3 (N-type first transistor) which are connected in series and perform an ON operation and an OFF operation alternately. An emitter (first main electrode) of the PNP-type transistor 2 and an emitter (first main electrode) of the NPN-type transistor 3 are connected to the gate of the switching element 1 via a resistor R1.

The signal generator 7 supplies a drive signal to a base (control electrode) of the PNP-type transistor 2 and a base (control electrode) of the NPN-type transistor 3 in the push-pull circuit 12 to alternately switch the PNP-type transistor 2 and the NPN-type transistor 3 ON and OFF.

The negative-voltage power supply 5 applies a negative voltage to the gate as a voltage when the switching element 1 is switched from an ON state to an OFF state.

The resistor R2 is a first potential adjustment resistor that is connected between the negative electrode of the negative-voltage power supply 5 and a collector (second main electrode) of the PNP-type transistor 2. The capacitor C1 is connected between the positive electrode of the negative-voltage power supply 5 and the collector of the PNP-type transistor 2. The positive electrode of the negative-voltage power supply 5 is connected to the capacitor C1 and the source of the switching element 1.

The resistor R3 is a second potential adjustment resistor that is connected between a collector (second main electrode) and the base of the NPN-type transistor 3. In the PNP-type transistor 2, in a case where the potential of the collector is close to the potential of the base when the switching element 1 is OFF, the resistor R3 adjusts the voltage immediately before turn-on of the gate voltage of the switching element 1, by division of voltage by the resistor R2 and the resistor R3. That is, the resistor R3 determines a convergence voltage of the gate voltage when the switching element 1 is OFF.

By reducing the value of the resistor R3, it is possible to increase the gate voltage immediately before switching the switching element 1 from the OFF state to the ON state.

The capacitor C1 and the resistors R2 and R3 form a voltage changing unit that changes the voltage immediately before the switching element 1 is switched from the OFF state to the ON state (hereinafter referred to as "turn-on") to be higher than the negative voltage from the negative-voltage power supply 5 immediately after the switching element 1 is switched from the ON state to the OFF state (hereinafter referred to as "turn-off").

The voltage changing unit changes the voltage immediately before the switching element 1 is turned off to be greater than the positive voltage and to be less than the threshold voltage of the switching element 1. The voltage changing unit also maintains the negative voltage immediately after the switching element 1 is turned off for a predetermined period of time when the switching element 1 is in the OFF state. The gate of the switching element 1 also has a resistor R1 that is used to adjust the switching speed.

Next, the operation of the driving circuit will be described. First, a turn-off operation of the switching element 1 will be described.

A negative voltage (for example, -1 V) is applied as a drive signal from the signal generator 7 to the base of the NPN-type transistor 3 and to the base of the PNP-type transistor 2 of the push-pull circuit 12. At the same time, the positive voltage (for example, 10 V) of the positive electrode of the positive-voltage power supply 4 is applied to the collector of the NPN-type transistor 3, and the negative voltage (for example, -10 V) of the negative electrode of the negative-voltage power supply 5 is applied to the collector of the PNP-type transistor 2.

Then, the NPN-type transistor 3 is switched off and the PNP-type transistor 2 is switched on. At this time, the negative voltage from the negative-voltage power supply 5 is applied to the gate of the switching element 1 via the resistor R2, the PNP-type transistor 2, and the resistor R1. That is, the gate of the switching element 1 becomes a negative voltage, which causes the switching element 1 to turn off.

At this time, since the electrical charge from the negative-voltage power supply 5 is charged to the capacitor C1, the capacitor C1 is connected in parallel with the gate capacitance of the switching element 1 at the moment when the PNP-type transistor 2 is switched on, thereby rapidly changing the gate potential of the switching element 1.

First, the gate potential of the switching element 1 is approximately -10 V in the above example, and the electrical charge is charged to the capacitor C1, thereby increasing the gate potential. At this time, the switching speed can be increased by reducing the resistor R1. This reduces the switching loss when the switching element 1 is turned off.

When the switching element 1 is used in a bridge circuit or the like, a voltage change between the drain and source occurs in the switching element 1 due to the on-operation of a switching element in another arm immediately after the switching element 1 is turned off. This voltage change causes a fluctuation in the gate voltage coupled by the parasitic capacitance of the switching element 1.

When the fluctuated gate voltage exceeds the threshold voltage of the switching element 1, erroneous turn-on of the switching element 1 occurs. At this time, the gate voltage that is lower than the threshold voltage of the switching element 1 can be maintained by raising the negative voltage of the negative-voltage power supply 5, that is, by increasing the negative voltage, or by increasing the capacitance of the capacitor C1. This makes it possible to suppress erroneous turn-on of the switching element 1.

Thereafter, based on the source electrode of the switching element 1, the gate voltage of the switching element 1 increases due to the positive-voltage power supply 4, the negative-voltage power supply 5, the division of voltage by the resistor R2 and the resistor R3, and the change in the electrical charge of the capacitor C1.

As a result, the gate voltage immediately before the switching element 1 is turned on can be set to a voltage that is less than the threshold voltage of the switching element 1 and close to the threshold voltage in advance. Therefore, in order to switch on the switching element 1, the gate voltage is increased from the voltage that is less than the threshold voltage of the switching element 1 and close to the threshold voltage to a voltage that is greater than the threshold voltage of the switching element 1 from the positive-voltage power supply 4, which results in a shorter turn-on time.

This makes it possible to suppress erroneous turn-on and to increase turn-on speed. Further, the turn-on time is reduced, thereby reducing the diode loss of the switching element 1.

Next, the turn-on operation of the switching element is as follows. A positive voltage (for example, +1 V) is applied from the signal generator 7 to the base of the NPN-type transistor 3 and the base of the PNP-type transistor 2.

At the same time, the positive voltage (for example, 10 V) of the positive electrode of the positive-voltage power supply 4 is applied to the collector of the NPN-type transistor 3, and the negative electrode (for example, -10 V) of the negative-voltage power supply 5 is applied to the collector of the PNP-type transistor 2. This switches on the NPN-type transistor 3 and switches off the PNP-type transistor 2.

At this time, the positive voltage of the positive-voltage power supply 4 is applied to the gate of the switching element 1 via the NPN-type transistor 3 and the resistor R1. That is, the gate of the switching element 1 becomes greater than the threshold voltage, which causes the switching element 1 to turn on.

Thus, in hard switching using a half-bridge circuit or the like, the driving circuit according to the first embodiment makes it possible to suppress erroneous turn-on by reducing the gate voltage immediately after the switching element 1 is turned off to the negative voltage.

In addition, the resistor R2, the resistor R3, and the capacitor C1 change the voltage immediately before the switching element 1 is turned on to be higher than the negative voltage from the negative-voltage power supply 5 immediately after the switching element 1 is turned off. This makes it possible to increase the turn-on speed of the switching element 1.

Further, the resistor R2, the resistor R3, and the capacitor C1 change the voltage immediately before the switching element 1 is turned on to be greater than the positive voltage and to be less than the threshold voltage of the switching element 1. That is, by increasing the gate voltage immediately before the switching element 1 is turned on to be greater than the positive voltage and to be close to the threshold voltage with respect to the source, it becomes possible to increase the turn-on speed of the switching element 1.

Further, when the switching element 1 is in the OFF state, the voltage changing unit maintains the negative voltage immediately after the switching element 1 is turned off for a predetermined period of time or longer, more specifically, for the dead time or longer. This makes it possible to prevent switching elements of upper and lower arms from switching ON simultaneously, thereby enhancing the effect of suppressing erroneous turn-on.

In addition, a simple and low-cost circuit configuration that is configured of the push-pull circuit 12, the resistor R2, the resistor R3, and the capacitor C1 makes it possible to suppress erroneous turn-on and increase turn-on speed.

Second Embodiment

Figure 2:
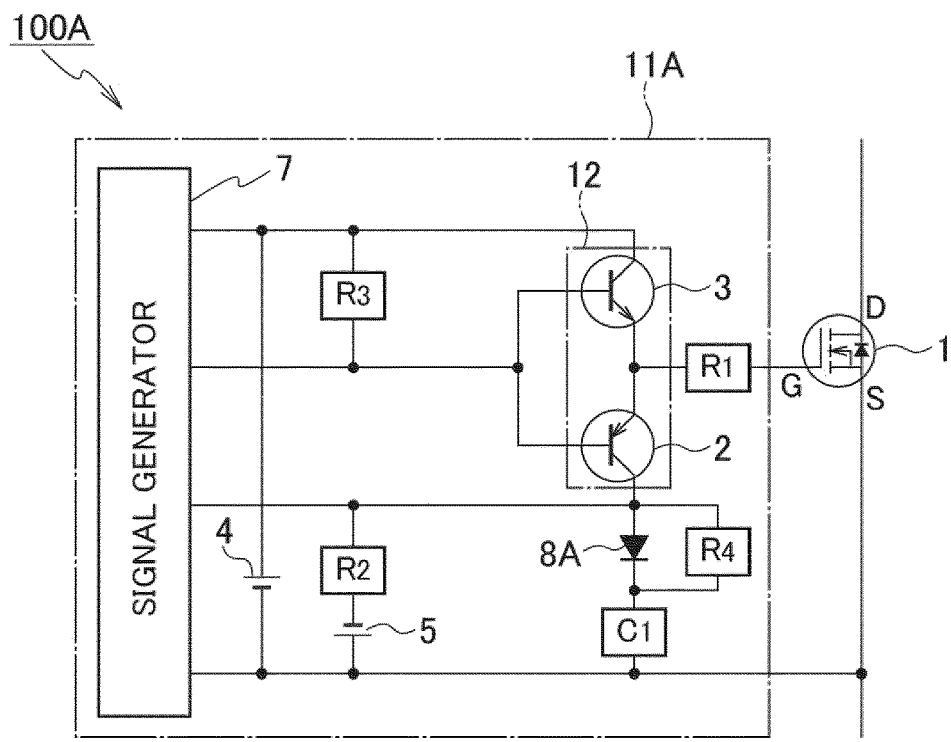
FIG. 2 is a configuration diagram of a driving circuit according to a second embodiment of the present invention.

FIG. 2 is a configuration diagram of a driving circuit according to a second embodiment of the present invention. The driving circuit according to the second embodiment differs from the driving circuit according to the first embodiment in that a resistor R4 and a diode 8A are provided.

The resistor R4 and the diode 8A are connected in parallel between the collector of the PNP-type transistor 2 and one end of the resistor R2, and one end of the capacitor C1.

An anode of the diode 8A is connected to the collector of the PNP-type transistor 2, and a cathode of the diode 8A is connected to one end of the capacitor C1.

Thus, the driving circuit of the second embodiment makes it possible to adjust the storage time of the electrical charge from the negative-voltage power supply 5 to the capacitor C1 by using the value of the resistor R4, because the resistor R4 is connected in series to the capacitor C1. The storage time becomes shorter as the resistor R4 becomes smaller, and the power storage time becomes longer as the resistor R4 becomes larger.

As a result, the gate voltage immediately after the switching element 1 is turned off can be changed to any voltage by adjusting the value of the resistor R4, and the optimal erroneous turn-on suppression voltage can be obtained by changing the gate voltage to the negative voltage with respect to the source.

Third Embodiment

Figure 3:
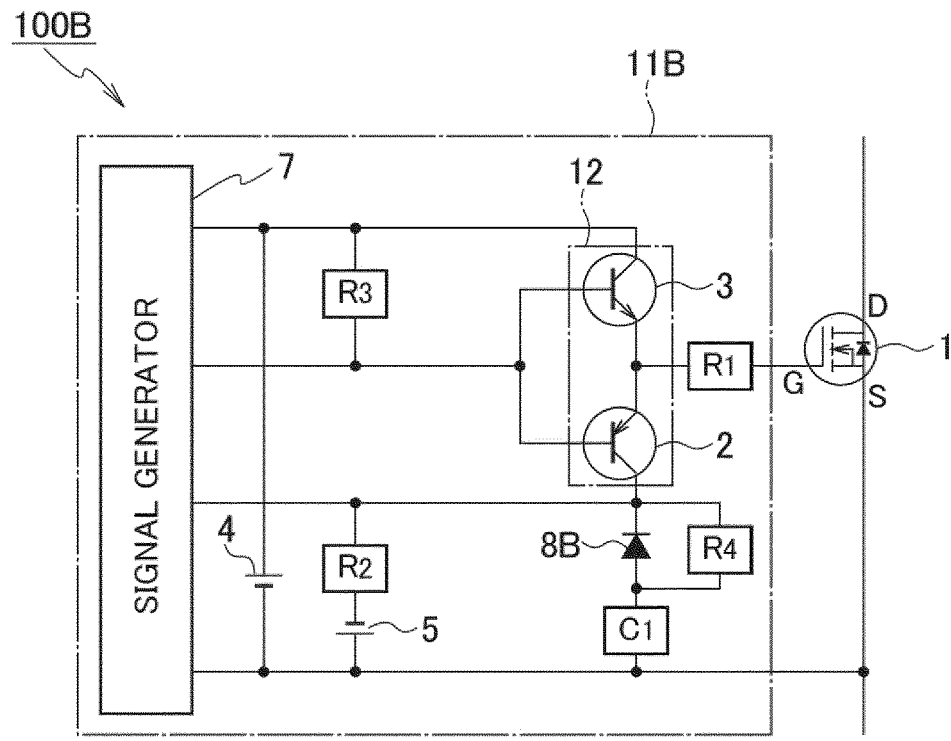
FIG. 3 is a configuration diagram of a driving circuit according to a third embodiment of the present invention.

FIG. 3 is a configuration diagram of a driving circuit according to a third embodiment of the present invention. The driving circuit according to the third embodiment differs from the driving circuit according to the second embodiment in that the diode 8B is inversely provided. A cathode of the diode 8B is connected to the collector of the PNP-type transistor 2, and an anode of the diode 8B is connected to one end of the capacitor C1.

Thus, the driving circuit according to the third embodiment makes it possible to reduce the storage time of the electrical charge from the negative-voltage power supply 5 to the capacitor C1. The electrical charge stored in the capacitor C1 is discharged to the discharge resistor R4. The discharge time can be adjusted by the value of the resistor R4.

This makes it possible for the switching speed when the switching element 1 is turned off to be changed in a discretionally manner by adjusting the value of the resistor R4, thereby making it possible to adjust the amount of change in the gate voltage at an optimal level.

Fourth Embodiment

Figure 4:
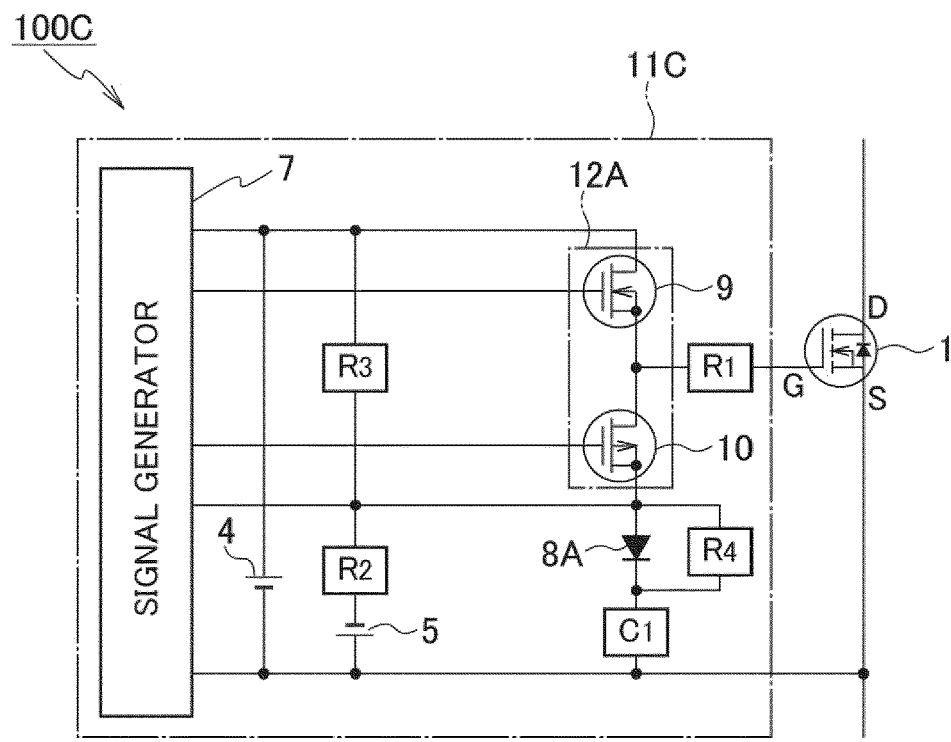
FIG. 4 is a configuration diagram of a driving circuit according to a fourth embodiment of the present invention.

FIG. 4 is a configuration diagram of a driving circuit according to a fourth embodiment of the present invention. The driving circuit according to the fourth embodiment differs from the driving circuit according to the second embodiment in that the push-pull circuit 12A is configured of an N-channel MOSFET 9 (N-type transistor) and a P-channel MOSFET 10 (P-type transistor).

A source of the N-channel MOSFET 9 and a source of the P-channel MOSFET 10 are connected to the gate of the switching element 1 via the resistor R1. A drive signal is applied to a gate of the N-channel MOSFET 9 and a gate of the P-channel MOSFET 10.

The positive electrode of the positive-voltage power supply 4 is connected to a drain of the N-channel MOSFET 9. The resistor R3 is connected between the drain of the N-channel MOSFET 9 and the source of the P-channel MOSFET 10.

The configuration other than the above is the same as that of the driving circuit according to the second embodiment. In addition, the operation when the switching element 1 is turned on and turned off is the same as the operation when the switching element 1 of the driving circuit according to the first embodiment is turned on and turned off, and thus the description thereof is omitted.

Thus, the driving circuit according to the fourth embodiment makes it possible to obtain the same effect as that of the driving circuit according to the second embodiment. Further, the use of the N-channel MOSFET 9 and the P-channel MOSFET 10 makes it possible to pass a large current through the gate of the switching element 1 with a smaller signal output from the signal generator 7.

This makes it possible for a large current to flow at a faster switching speed when the switching element 1 is turned on and turned off, thereby reducing the switching loss.

Fifth Embodiment

Figure 5:
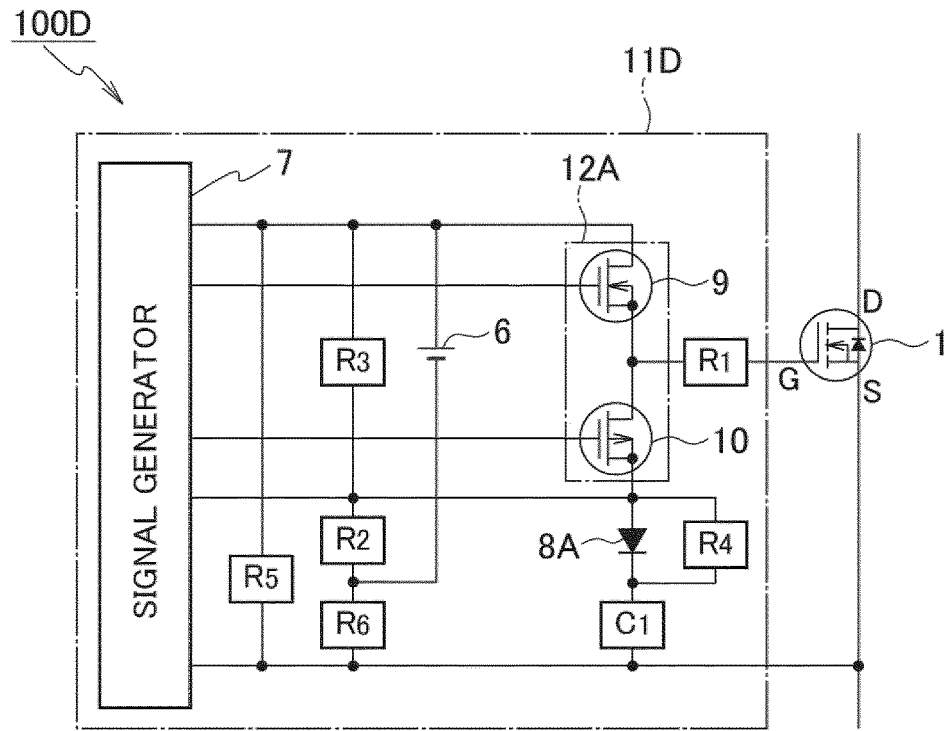
FIG. 5 is a configuration diagram of a driving circuit according to a fifth embodiment of the present invention.

FIG. 5 is a configuration diagram of a driving circuit according to a fifth embodiment of the present invention. The driving circuit according to the fifth embodiment differs from the driving circuit according to the fourth embodiment in that a resistor R5 is provided in place of the positive-voltage power supply 4, a resistor R6 is provided in place of the negative-voltage power supply 5, and a positive-voltage power supply 6 is further provided.

A positive electrode of the positive-voltage power supply 6 is connected to the drain of the N-channel MOSFET 9, one end of the resistor R3, and one end of the resistor R5. A negative electrode of positive-voltage power supply 6 is connected to one end of the resistor R2 and one end of the resistor R6.

Thus, according to the driving circuit according to the fifth embodiment, the positive voltage of the positive-voltage power supply 6 is divided by the resistor R5 and the resistor R6. In this case, a current flows from the positive electrode of the positive-voltage power supply 6 to the negative electrode of the positive-voltage power supply 6 via the resistor R5 and the resistor R6.

The source of the switching element 1 is connected to the other end of the resistor R6, which makes the potential of one end of the resistor R6 to be lower than the potential of the source of the switching element 1 and results in a negative voltage. For this reason, when the P-channel MOSFET 10 is ON, the negative voltage of one end of the resistor R6 is applied to the gate of the switching element 1, thereby causing the switching element 1 to turn off.

That is, the positive voltage of the positive-voltage power supply 6 is divided by the resistor R5 and the resistor R6, and thus the positive voltage of the positive-voltage power supply 6 can be used as the gate voltage of the switching element 1. This makes it possible to configure a compact driving circuit 11D including only passive elements of the resistor R5 and the resistor R6 by using the one positive-voltage power supply 6.

Sixth Embodiment

Figure 6:
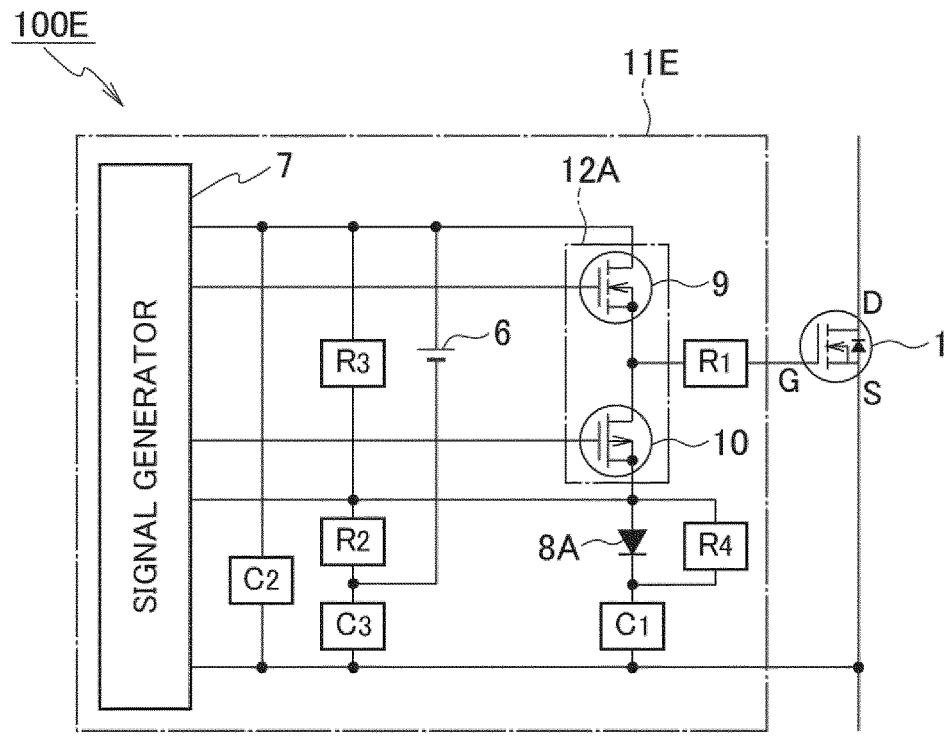
FIG. 6 is a configuration diagram of a driving circuit according to a sixth embodiment of the present invention.

FIG. 6 is a configuration diagram of a driving circuit according to a sixth embodiment of the present invention. The driving circuit according to the sixth embodiment differs from the driving circuit according to the fourth embodiment in that a capacitor C2 is provided in place of the positive-voltage power supply 4, a capacitor C3 is provided in place of the negative-voltage power supply 5, and a positive-voltage power supply 6 is further provided.

A positive electrode of the positive-voltage power supply 6 is connected to the drain of the N-channel MOSFET 9, one end of the resistor R3, and one end of the capacitor C2. A negative electrode of the positive-voltage power supply 6 is connected to one end of the resistor R2 and one end of the capacitor C3.

Thus, in the driving circuit according to the sixth embodiment, the positive voltage of the positive-voltage power supply 6 is divided by the capacitor C2 and the capacitor C3. In this case, a current transitionally flows from the positive electrode of the positive-voltage power supply 6 to the negative electrode of the positive-voltage power supply 6 via the capacitor C2 and the capacitor C3.

The source of the switching element 1 is connected to the other end of the capacitor C3, which makes the potential of one end of the capacitor C3 to be lower than the potential of the source of the switching element 1 and results in a negative voltage. For this reason, when the P-channel MOSFET 10 is ON, the negative voltage of one end of the capacitor C3 is applied to the gate of the switching element 1, thereby causing the switching element 1 to turn off.

That is, the positive voltage of the positive-voltage power supply 6 is divided by the capacitor C2 and the capacitor C3, and thus the positive voltage of the positive-voltage power supply 6 can be used as the gate voltage of the switching element 1. This makes it possible to configure a compact driving circuit 11D including only passive elements of the capacitor C2 and the capacitor C3 by using the one positive-voltage power supply 6.

In addition, the driving circuit can be charged by transitionally supplying a current through the capacitor C2 and the capacitor C3, and thus the current consumption from the positive voltage power supply 6 can be reduced at all times, which results in a low-loss driving circuit.

INDUSTRIAL APPLICABILITY

The driving circuit of the present invention is applicable to switching circuit devices.

REFERENCE SIGNS LIST

1: switching element
2: PNP-type transistor
3: NPN-type transistor
4, 6: positive-voltage power supply
5: negative-voltage power supply
7: signal generator
8A, 8B: diode
9: N-channel MOSFET
10: P-channel MOSFET
11, 11A, 11B, 11C, 11D, 11E: driving circuit
12, 12A: push-pull circuit
R1 to R6: resistor
C1 to C3: capacitor

The invention claimed is:

1. A driving circuit for applying a voltage to a switching element to switch between an ON state and an OFF state, the switching element including a control terminal, a high-potential terminal, and a low-potential terminal, and switched between the ON state in which a current flows between the high-potential terminal and the low-potential terminal and the OFF state in which the current does not flow therebetween, depending on the voltage of the control terminal in a case in which a potential of the low-potential terminal is defined as a reference potential, the driving circuit comprising:

a negative-voltage power supply for applying a negative voltage as the voltage to the control terminal when the switching element is switched from the ON state to the OFF state;

a voltage changing unit for changing the negative voltage applying to the control terminal from the negative-voltage power supply; and a push-pull circuit comprising an N-type first transistor and a P-type second transistor which are connected in series and perform an ON operation and an OFF operation alternately, and in which a first main electrode of the first transistor and a first main electrode of the second transistor are connected to the control terminal, wherein the voltage changing unit comprises:

a potential adjustment resistor which is connected in series between a negative electrode of the negative-voltage power supply and a second main electrode of the second transistor, a capacitor which is connected in series between the low-potential terminal and the second main electrode of the second transistor, and a positive electrode of the negative-voltage power supply is connected to the capacitor and the low-potential terminal; and the voltage changing unit changes the voltage immediately before the switching element is switched from the OFF state to the ON state to be higher than the negative voltage from the negative-voltage power supply immediately after the switching element is switched from the ON state to the OFF state.

2. The driving circuit according to claim 1, wherein the voltage changing unit changes the voltage immediately before the switching element is switched from the OFF state to the ON state to be greater than a positive voltage and to be less than a threshold voltage of the switching element.

3. The driving circuit according to claim 1, wherein the voltage changing unit maintains the negative voltage immediately after the switching element is switched from the OFF state to the ON state for a predetermined period of time when the switching element is in the OFF state.

4. The driving circuit according to claim 1, wherein the voltage immediately before the switching element is switched from the OFF state to the ON state increases due to division of voltage by the negative-voltage power supply and the potential adjustment resistor and a change in electrical charge of the capacitor, and is changed to be greater than the positive voltage and to be less than the threshold voltage of the switching element.

5. The driving circuit according to claim 1, further comprising:
a diode and a discharge resistor, wherein
the diode and the discharge resistor are connected in parallel between the capacitor and the second main electrode of the second transistor, and
an anode of the diode is connected to the second main electrode of the second transistor.

6. The driving circuit according to claim 1, further comprising:
a positive-voltage power supply for applying a positive voltage to the control terminal as the voltage when the switching element is switched from the OFF state to the ON state, wherein
the positive voltage from the positive-voltage power supply immediately after the switching element is switched from the OFF state to the ON state is greater than the threshold voltage of the switching element.

7. A driving circuit for applying a voltage to a switching element to switch between an ON state and an OFF state, the switching element including a control terminal, a high-potential terminal, and a low-potential terminal, and switched between the ON state in which a current flows between the high-potential terminal and the low-potential terminal and the OFF state in which the current does not flow therebetween, depending on the voltage of the control terminal in a case in which a potential of the low-potential terminal is defined as a reference potential, the driving circuit comprising:
a negative-voltage power supply;
a positive-voltage power supply;
a push-pull circuit comprising an N-type first transistor and a P-type second transistor which are connected in series and perform an ON operation and an OFF operation alternately, and in which a first main electrode of the first transistor and a first main electrode of the second transistor are connected to the control terminal;
a first potential adjustment resistor which is connected in series between a negative electrode of the negative-voltage power supply and a second main electrode of the second transistor;
a capacitor connected in series between the low-potential terminal and the second main electrode of the second transistor; and
a second potential adjustment resistor having one end connected to a second main electrode of the first transistor and a positive electrode of the positive-voltage power supply, wherein
a positive electrode of the negative-voltage power supply is connected to a negative electrode of the positive-voltage power supply, the capacitor, and the low-potential terminal.

* * * * *